United States Patent [19]

Lake, Jr. et al.

[11] Patent Number: 4,648,737
[45] Date of Patent: Mar. 10, 1987

[54] THEFT PREVENTION APPARATUS

[75] Inventors: Ralph J. Lake, Jr., Somerville; Thomas P. Iosso, Middlesex, both of N.J.

[73] Assignee: Burroughs Corporation, Detroit, Mich.

[21] Appl. No.: 748,194

[22] Filed: Jun. 24, 1985

[51] Int. Cl.⁴ .................. F16B 21/00; H01R 13/62
[52] U.S. Cl. .................. 403/322; 403/348; 403/405.1; 403/407.1; 403/315; 339/91 R; 339/75 M; 312/111; 312/107.5; 220/23.4; 206/821
[58] Field of Search .............. 403/6, 9, 321, 322, 403/407.1, 405.1, 408.1, 315, 348, 349; 312/111, 107, 198, 107.5; 220/23.4, 300, 297, 293; 206/821; 16/319; 339/91 R, 75 M; 464/177, 901; 211/4

[56] References Cited

U.S. PATENT DOCUMENTS

| | | | |
|---|---|---|---|
| 1,803,847 | 5/1931 | Ellis | 220/297 |
| 1,914,780 | 6/1933 | Lichamer . | |
| 2,040,374 | 5/1936 | Grimes | 403/408.1 X |
| 2,581,816 | 1/1952 | Schlueter | 403/407.1 X |
| 3,339,954 | 9/1967 | Alvden | 403/322 |
| 3,473,649 | 10/1969 | Posso | 220/300 X |
| 4,084,865 | 4/1978 | Joyce | 312/111 |
| 4,097,166 | 6/1978 | Stava | 403/321 |
| 4,103,511 | 8/1978 | Kress et al. | 403/349 X |
| 4,165,908 | 8/1979 | Cooper et al. | 312/111 |
| 4,198,040 | 4/1980 | Colasent | 220/300 X |
| 4,251,166 | 2/1981 | Lautenschlager et al. | 403/408.1 |
| 4,316,676 | 2/1982 | Turner | 403/405.1 |
| 4,333,508 | 6/1982 | Sweigart, Jr. | 220/300 X |
| 4,439,971 | 4/1984 | Rutherford | 403/321 X |
| 4,466,551 | 8/1984 | Leung | 220/293 |
| 4,501,460 | 2/1985 | Sisler | 339/91 R |

FOREIGN PATENT DOCUMENTS

| | | | |
|---|---|---|---|
| 90160 | 2/1959 | Netherlands | 312/107.5 |
| 1188285 | 4/1970 | United Kingdom | 220/23.4 |

Primary Examiner—Cornelius J. Husar
Assistant Examiner—Todd G. Williams
Attorney, Agent, or Firm—Mark T. Starr

[57] ABSTRACT

Means for coupling together two assemblies wherein each assembly includes a hole in which a bracket can be inserted, with the brackets being held together by a lock. Additionally, the assemblies are coupled together by a rotatable locking plate which cannot be rotated to disconnect the assemblies when the brackets and lock are in place.

30 Claims, 6 Drawing Figures

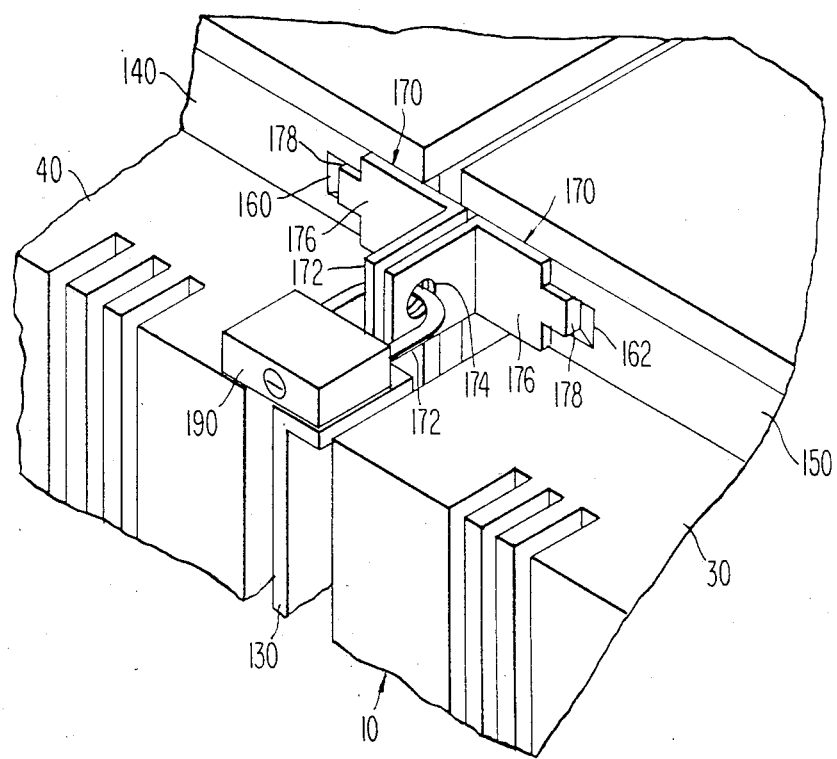

THEFT PREVENTION APPARATUS

BACKGROUND OF THE INVENTION

Present day computer systems include various modules which are coupled together to make up the entire system. As an example, several disk drivers may be coupled together and to a CPU module by a mechanism which also permits uncoupling, and, as a result, portions of such systems may be stolen or just borrowed by a fellow worker. In either case, the removal of a portion of a computer system may cause considerable inconvenience.

The present invention provides a simple and efficient theft prevention arrangement for computer systems and the like.

DESCRIPTION OF THE DRAWINGS

FIG. 5 is a perspective view of other apparatus of the invention; and

FIG. 6 is the same view as FIG. 4 with the apparatus of the invention shown in FIG. 5 in place.

DESCRIPTION OF THE INVENTION

Figure 1:
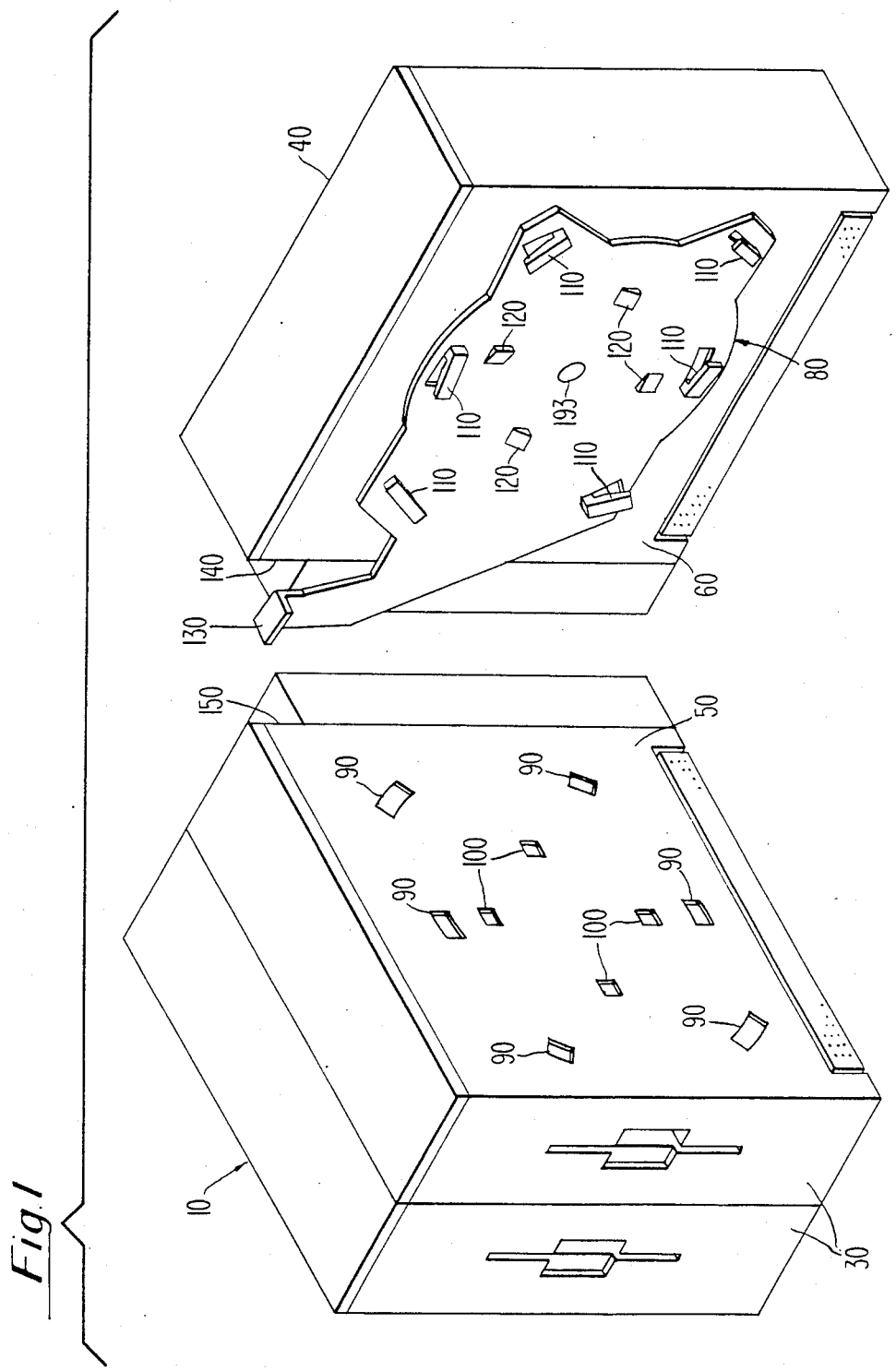
FIG. 1 is a perspective view of separated modules of a computer system with which the invention is employed.

The principles of the invention can be used to couple together substantially any two assemblies or housings for electronic or other apparatus. For purposes of illustration, the invention is used to couple together a disk drive assembly 10 and a central processor unit module (CPU) 40 (FIG. 1).

The disk drive assembly 10 comprises one or more disk drive units 30, and one end wall of the assembly comprises a metal plate 50. The CPU module 40 similarly includes an end wall formed by a metal plate 60, to which a coupling plate 80 is rotatably secured at its center 193. Plate 50 is provided with an array of curved openings 90 on a first outer circumference and an array of second smaller inner openings 100 on a smaller inner circumference.

Figure 2:
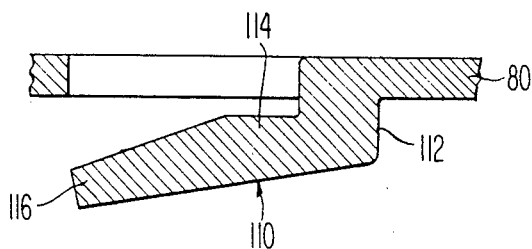
FIG. 2 is a sectional view of a portion of the apparatus of FIG. 1.

The rotatable plate 80, which is used for coupling together the two assemblies 10 and 40, is provided on its free surface, which can be seen in FIG. 1, with a plurality of locking ramps 110 arrayed on a first circumference to match the openings in plate 50. The ramps 110 (FIG. 2) comprise brackets which are secured to the plate 80 at one end 112 and include a first portion 114 which lies generally parallel to but spaced from the plate 80 and an end portion 116 which tapers outwardly away from the main body of the plate 80.

Figure 3:
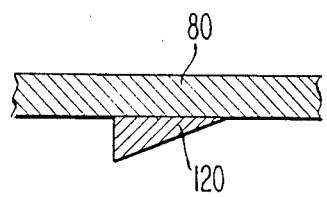
FIG. 3 is a sectional view of another portion of the apparatus of FIG. 1.

A plurality of small wedge-shaped members 120 (FIGS. 1 and 3), known as ejection wedges, are formed on the free surface of the coupling plate 80 and are positioned to align with the openings 100 in plate 50.

The coupling plate 80 is provided with a projecting portion 130 which is used as a handle.

Figure 4:
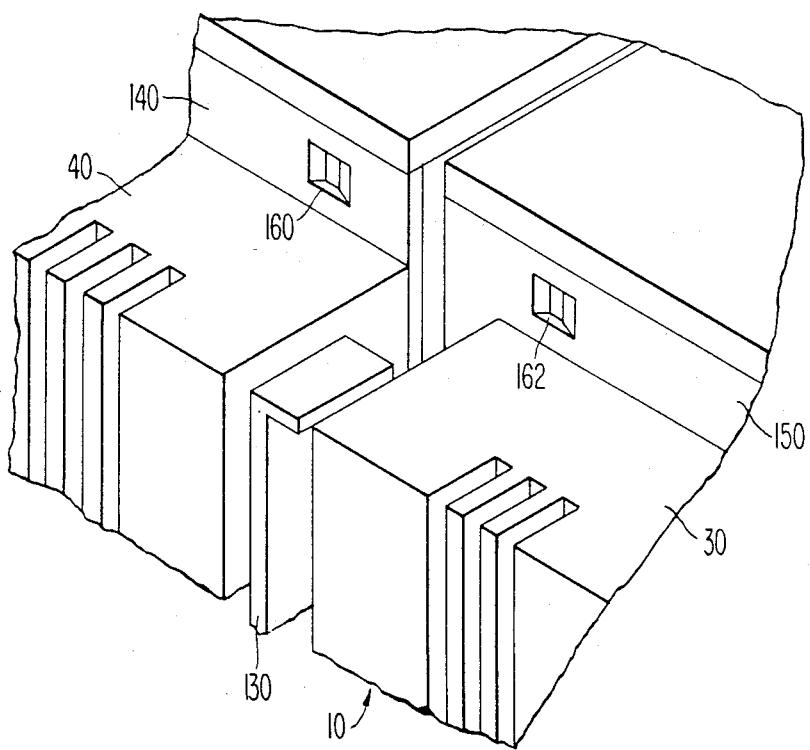
FIG. 4 is a perspective view of portions of the apparatus of FIG. 1 coupled together and including a portion of the apparatus of the invention.

In operation of the mechanism thus far described, first, the two assemblies 10 and 40 are positioned facing each other with the plate 80 rotated clockwise, in which position, the locking ramps 110 are generally aligned with the apertures 90, and the wedges 120 are aligned with the apertures 100 in plate 50. The two assemblies are brought together and adjusted so that the locking ramps 110 enter their associated apertures 90 in plate 50, and the wedges 120 enter apertures 100, and the plate 80 is rotated counter-clockwise to cause the locking ramps 110 to tightly engage the plate 50 and to lock the two assemblies together. With the parts locked together, the handle 130 is down near the bases 140, 150 of the assemblies, as shown in FIG. 4.

To disconnect the assemblies, the handle 130 is pushed upwardly and the assemblies are manipulated to disengage assembly 10 from the coupling plate 80 which remains secured to plate 60 of assembly 40. It is noted that, as the handle 130 is pushed upwardly and the coupling plate 80 rotates with respect to the plate 50, the wedges 120 ride out of the openings 100 in plate 50 and then push against the solid portion of plate 50 and thus assist the separation process.

According to the invention, to lock the disk drive assembly 10 and CPU 40 together, the bases 140 and 150 of the housings of the assemblies near their adjacent edges are provided with aligned holes 160, 162, into each of which a locking bracket 170 is inserted. The locking brackets 170 are identical, and they each include a first leg 172 having a hole 174, a second leg 176 which is disposed at a right angle to the first, a third leg 178 which is disposed at a right angle extending rearwardly to leg 176, and finally a short curved leg 180 which extends away from leg 178.

In using the brackets 170, they are positioned with the legs 172 adjacent to and facing each other with the holes 178 aligned, and the legs 174 and curved portions 180 are inserted in the holes 160, 162 in the bases 140, 150 of the housings. The parts are arrayed so that the legs 174 contact each other and the legs 170 rest on the walls of the housings in which the holes 160, 162 are formed. A conventional key lock 190 is secured to the legs 172 of the brackets 170, and the lock body lies close to the handle 130 of the coupling plate 80.

It is noted that the lock 190 and the locking plate handle 130 provide a complementary function. When the parts are locked together, the handle 130 cannot be moved upwardly toward the lock 190 to disengage the assemblies 10 and 40 because the lock 190 is in the way. If the handle did not operate in this way, that is, if it were not prevented from rotating to separate the assemblies, the assemblies could be separated sufficiently to let the brackets 170 drop out of the holes 160, 162, and the locking mechanism would thus fall off.

What is claimed is:

1. A coupling arrangement comprising:
   a first assembly;
   a first plate having apertures therethrough, forming an end wall of said first assembly;
   a second assembly;
   a rotatable coupling plate forming an end wall of said second assembly;
   securing means on said coupling plate for rotatably securing said coupling plate to said first plate whereby said first and second assemblies are coupled together;
   locking means for locking together said first and second assemblies after they have been coupled together, said locking means further for preventing rotation of said coupling plate while said locking means is in place, whereby said first and second assemblies may not be uncoupled while said locking means is in place; and wherein said locking means comprises two brackets coupled one to each of said assemblies and a lock securing together said brackets.

2. The apparatus defined in claim 1 wherein each of said assemblies includes a hole in which one end of said brackets is inserted.

3. The apparatus defined in claim 2 wherein said coupling plate includes a handle which, when said assemblies are coupled together, lies adjacent to said locking means and cannot be rotated to decouple said assemblies.

4. A coupling arrangement comprising:
a first assembly;
a first plate having apertures therethrough, forming an end wall of said first assembly;
a second assembly;
a rotatable coupling plate forming an end wall of said second assembly;
securing means on said coupling plate for rotatably securing it to said first plate whereby said first and second assemblies are coupled together;
locking means for locking together said first and second assemblies after they have been coupled together, said locking means further for preventing rotation of said coupling plate while said locking means is in place; and
wherein said coupling plate includes a handle which, when said assemblies are coupled together, lies adjacent to said locking means and cannot be rotated to decouple said assemblies.

5. The apparatus defined in claim 4 wherein said locking means comprises two brackets coupled one to each of said assemblies and a lock securing together said brackets.

6. In a system first and second assemblies having cooperating pin and socket connector portions disposed along respective first and second walls, an improved coupling mechanism for effecting engagement of said pin and socket connector portions, comprising:
portions of said first wall being formed with a first plurality of apertures therein;
manually actuable means, pivotingly joined to said second wall, for engaging said first plurality of apertures and drawing said first and second walls towards each other after having brought said manually actuable means into an interfitting relation with said first plurality of apertures and thereafter having rotated said manually actuable means in a first direction from a first position to a second position, thereby effecting the engagement of said pin and socket connector portions; and
locking means, engageable with said first and second assemblies subsequent to having brought said manually actuable means into said interfitting relation with said first plurality of apertures and having rotated said manually actuable means to said second position, for preventing rotation of said manually actuable means from said second position to said first position, whereby said first and second assemblies may not be separated when said locking means is engaged.

7. The system according to claim 6 wherein said locking means includes:

two brackets, each of said two brackets engageable with a respective one of said first and second assemblies; and
padlock means, engageable with said two brackets, for securing said two brackets together;
wherein each of said assemblies includes a mounting hole in which one end of said brackets is inserted.

8. The system according to claim 6 wherein said manually actuable means includes a coupling plate having front and rear surfaces, the rear surface facing said second wall, a plurality of locking ramp members carried on said front surface.

9. The system according to claim 8 wherein said coupling plate includes a generally tangentially extending handle, wherein said locking means is positioned to block movement of said handle, whereby said manually actuable means cannot be rotated from said second position to said first position unless said locking means is removed.

10. The system according to claim 8 wherein:
portions of said first wall are formed with a second plurality of apertures therein; and
a plurality of ejection wedges are carried on said front surface of said coupling plate.

11. The system according to claim 10 wherein each of said ejection wedges is a right triangular wedge, the base of said right triangular wedge positioned on said front surface, each of said ejection wedges positioned to enter one of said second plurality of apertures when said manually actuable means is in the second position.

12. The system according to claim 8 wherein said coupling plate includes a generally tangentially extending handle, said locking means engagable with said first and second assemblies at a position wherein said handle is adjacent to said locking means, whereby said manually actuable means cannot be rotated from the second position to the first position.

13. The system according to claim 12 wherein said locking means includes:
two brackets, each of said two brackets engageable with a respective one of said first and second assemblies; and
padlock means, engageable with said two brackets, for securing said two brackets together.

14. The system according to claim 13 wherein each of said brackets includes a first leg having a hole, a second leg contiguous with and disposed at a right angle to the first leg, a third leg contiguous with and disposed at a right-angle to the second leg in a direction away from the first leg, and a forth leg contiguous with and disposed at a right angle to the third leg in a direction away from the second leg.

15. The system according to claim 14 wherein each of said two assemblies includes a mounting hole with which the forth leg of one of said brackets is engaged.

16. The system according to claim 15 wherein said padlock means includes a padlock.

17. The system according to claim 13 wherein each of said assemblies includes a mounting hole in which one end of one of said brackets is inserted.

18. The system according to claim 17 wherein each of said brackets includes a lock receiving hole, said padlock means passing through the lock receiving hole in each of said brackets.

19. The system according to claim 18 wherein said padlock means includes a padlock.

20. A coupling arrangement comprising:

a first assembly having a first end wall, portions of said first wall being formed with a first plurality of apertures therein;

a second assembly having a second end wall;

manually actuable means, pivotingly joined to said second wall, for engaging said first plurality of apertures and drawing said first and second walls towards each other after having brought said manually actuable means into an interfitting relation with said first plurality of apertures and thereafter having rotated said manually actuable means in a first direction from a first position to a second position; and locking means, engageable with said first and second assemblies subsequent to having brought said manually actuable means into said interfitting relation with said first plurality of apertures and having rotated said manually actuable means to said second position, for preventing rotation of said manually actuable means from said second position to said first position, whereby said first and second assemblies may not be separated when said locking means is engaged.

21. The coupling arrangement according to claim 20 wherein:

said locking means includes two brackets, each one of said brackets engageable with one of said assemblies, and padlock means for securing said brackets together; and each of said assemblies includes a mounting hole into which one of said brackets is inserted.

22. The coupling arrangement according to claim 20 further comprising:

portions of said first wall being formed with a second plurality of apertures therein;

wherein said coupling plate has front and rear surfaces, said rear surface facing said second wall, a plurality of ejection wedges carried on said front surface, said second plurality of apertures sized and positioned to accommodate said plurality of ejection wedges when said manually actuable means is in said second position;

wherein said locking means includes two brackets, each of said brackets engageable with one of said assemblies, and padlock means for securing said brackets together.

23. The coupling arrangement according to claim 20 wherein said manually actuable means includes a rotatable coupling plate, a handle extending from said rotatable coupling plate, wherein said locking means is positioned to block movement of said handle when said locking means is engaged with said first and second assemblies, whereby said locking means must be removed to make the transition of said manually actuable means from said second position to said first position.

24. The coupling arrangement according to claim 23 wherein said locking means includes two brackets, each one of said brackets engageable with one of said assemblies, and padlock means for securing said brackets together.

25. The coupling arrangement according to claim 24 wherein each of said assemblies includes a mounting hole into which one of said brackets is inserted.

26. The coupling arrangement according to claim 25 wherein each of said brackets includes a first leg having a hole therethrough, a second leg contiguous with and perpendicular to said first leg, a third leg contiguous with and perpendicular to said second leg and a fourth leg contiguous with and perpendicular to said third leg.

27. The coupling arrangement according to claim 26 wherein said locking means further includes a padlock.

28. The coupling arrangement according to claim 24 further comprising:

portions of said first wall being formed with a second plurality of apertures therein;

wherein said coupling plate has front and rear surfaces, the rear surface facing said second wall, a plurality of ejection wedges carried on said front surface, said second plurality of apertures sized and positioned to accomodate said plurality of ejection wedges when said manually actuable means is in said second position.

29. The coupling arrangement according to claim 28 wherein a plurality of locking ramp members are carried on said front surface, said first plurality of apertures sized and positioned to accomodate said plurality of locking ramp members when said manually actuable means is in said second position.

30. The coupling arrangement according to claim 29 wherein said coupling plate is captively connected to said second wall by a pivot.

* * * * *